(12) United States Patent
Chen et al.

(10) Patent No.: US 11,973,113 B2
(45) Date of Patent: *Apr. 30, 2024

(54) SEMICONDUCTOR DEVICE (71) Applicant: Taiwan Semiconductor Manufacturing Company, Ltd., Hsinchu (TW)

(72) Inventors: Chia-Chung Chen, Keelung (TW); Chi-Feng Huang, Hsinchu County (TW); Victor Chiang Liang, Hsinchu (TW); Chung-Hao Chu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/876,566

(22) Filed: Jul. 29, 2022

(65) Prior Publication Data

US 2022/0367634 A1    Nov. 17, 2022

Related U.S. Application Data

(63) Continuation of application No. 16/888,816, filed on May 31, 2020, now Pat. No. 11,456,355, which is a continuation of application No. 15/979,492, filed on May 15, 2018, now Pat. No. 10,672,873.

(51) Int. Cl.
*H01L 29/76* (2006.01)
*H01L 21/762* (2006.01)
*H01L 21/768* (2006.01)
*H01L 23/528* (2006.01)
*H01L 29/10* (2006.01)
*H01L 29/94* (2006.01)

(52) U.S. Cl.
CPC .... *H01L 29/1033* (2013.01); *H01L 21/76205* (2013.01); *H01L 21/76224* (2013.01); *H01L 21/76816* (2013.01); *H01L 23/5283* (2013.01)

(58) Field of Classification Search
CPC .......... H01L 29/1033; H01L 21/76205; H01L 21/76224; H01L 21/76816; H01L 23/5283; H01L 29/0847; H01L 29/66575; H01L 29/78
USPC ........................................................ 257/288
See application file for complete search history.

(56) References Cited

U.S. PATENT DOCUMENTS 10,672,873 B2 *  6/2020  Chen ................. H01L 21/76816
2019/0019472 A1 *  1/2019  Chin .................... H01L 29/7816

* cited by examiner

*Primary Examiner* — Theresa T Doan
(74) *Attorney, Agent, or Firm* — JCIPRNET (57) ABSTRACT

Provided is a semiconductor device including a substrate having a lower portion and an upper portion on the lower portion; an isolation region disposed on the lower portion of the substrate and surrounding the upper portion of the substrate in a closed path; a gate structure disposed on and across the upper portion of the substrate; source and/or drain (S/D) regions disposed in the upper portion of the substrate at opposite sides of the gate structure; and a channel region disposed below the gate structure and abutting between the S/D regions, wherein the channel region and the S/D regions have different conductivity types, and the channel region and the substrate have the same conductivity type.

20 Claims, 5 Drawing Sheets

SEMICONDUCTOR DEVICE

CROSS-REFERENCE TO RELATED APPLICATION

This is a continuation application of and claims the priority benefit of U.S. application Ser. No. 16/888,816, filed on May 31, 2020, now allowed. The U.S. application Ser. No. 16/888,816 is a continuation application of and claims the priority benefit of U.S. application Ser. No. 15/979,492, filed on May 15, 2018, now U.S. Pat. No. 10,672,873, issued on Jun. 2, 2020. The entirety of each of the above-mentioned patent applications is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

In general, the semiconductor device includes various transistors with various threshold voltages to meet customers' need. A native transistor is a kind of the MOS field-effect transistors that are intermediate between enhancement and depletion modes. That is to say, the native transistor is a transistor with nearly zero or negative threshold voltage, while the native transistor has better electron mobility. Therefore, the native transistor is useful for low-voltage, analog, and mixed signal applications. However, there are quite a few challenges to be handled for the native transistor, such as leakage issue, threshold voltage not-matching target issue, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
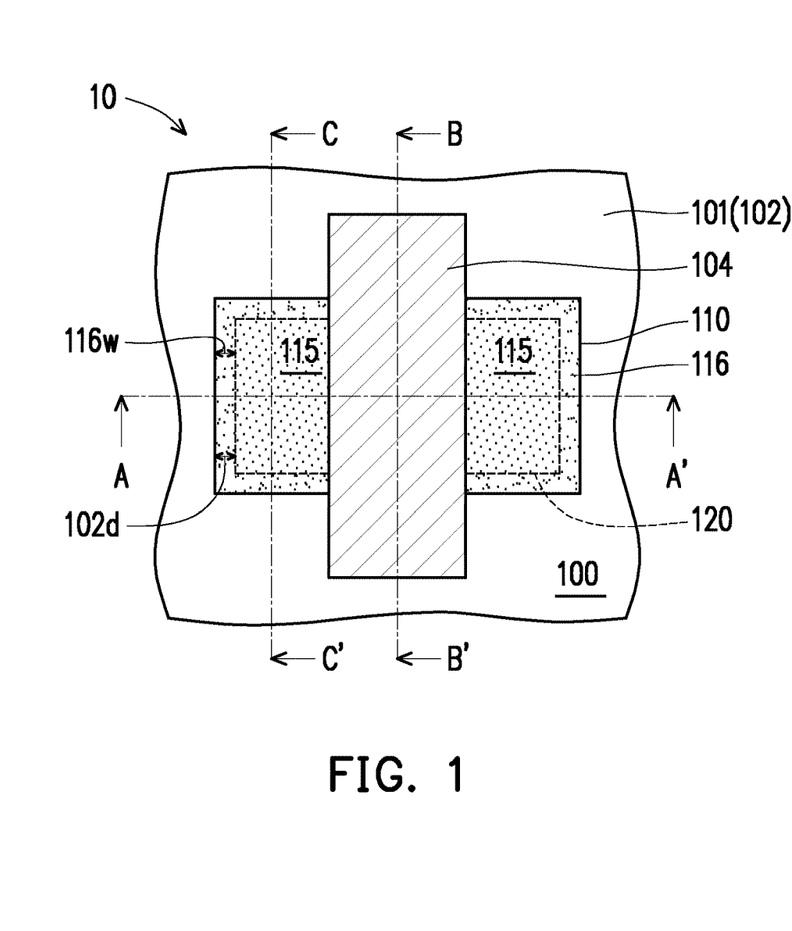
FIG. 1 is a top view of a semiconductor device in accordance with a first embodiment.
Figure 2A:
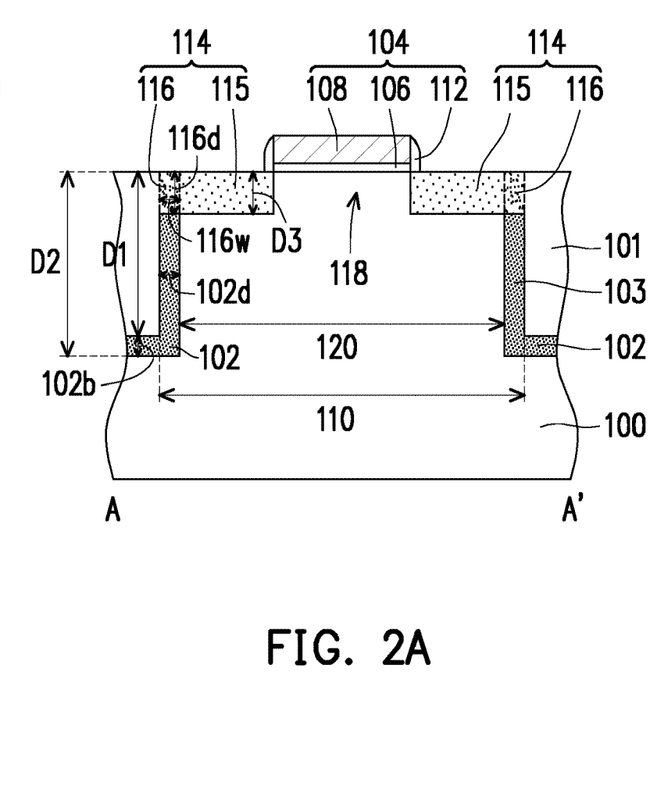
FIG. 2A is a cross-sectional view of the semiconductor device taken along the line A-A' of FIG. 1.
Figure 2B:
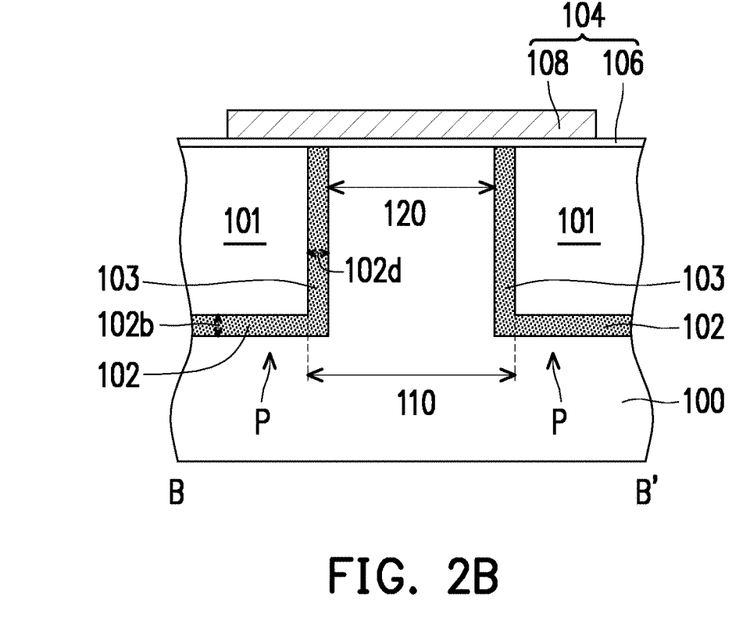
FIG. 2B is a cross-sectional view of the semiconductor device taken along the line B-B' of FIG. 1.
Figure 2C:
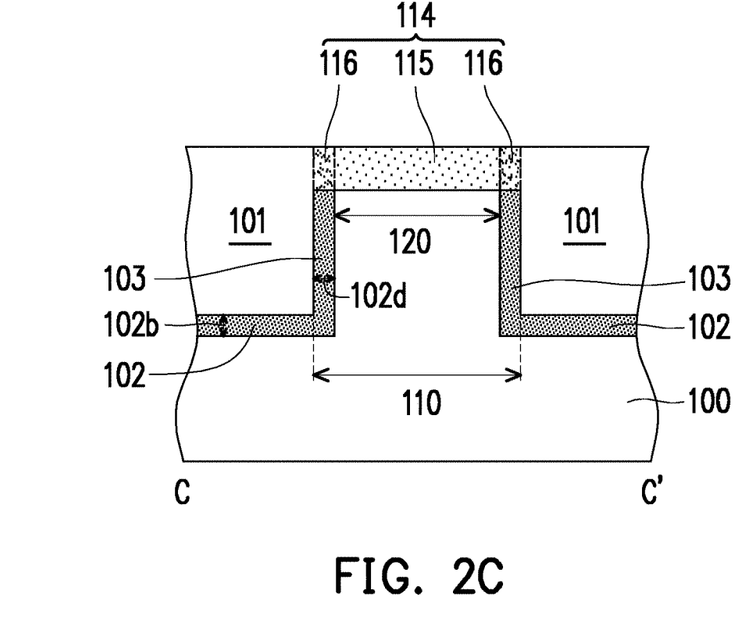
FIG. 2C is a cross-sectional view of the semiconductor device taken along the line C-C' of FIG. 1.

FIG. 1 is a top view of a semiconductor device in accordance with a first embodiment. FIG. 2A is a cross-sectional view of the semiconductor device taken along the line A-A' of FIG. 1. FIG. 2B is a cross-sectional view of the semiconductor device taken along the line B-B' of FIG. 1. FIG. 2C is a cross-sectional view of the semiconductor device taken along the line C-C' of FIG. 1. FIGS. 1, 2A, 2B, and 2C will be discussed concurrently and have been simplified for the sake of clarity to better understand the inventive concepts of the present disclosure. Additional features can be added in a semiconductor device 10, and some of the features described below can be replaced or eliminated for other embodiments of the semiconductor device 10.

In some embodiments, the semiconductor device 10 illustrated in FIG. 1 is a native transistor. However, the embodiments of the present invention are not limited thereto. Here, the native transistor may include a native NMOS transistors which can be formed without threshold adjusting dopants in the channel region as found in conventional MOS transistors. For example, a native NMOS transistor may be fabricated without P well and threshold voltage (Vt) implants typically utilized in a conventional NMOS device.

Referring to FIG. 1 and FIG. 2A, the semiconductor device 10 includes a substrate 100 having a first conductivity type, an isolation structure 101, a well region 102 having the first conductivity type, a gate structure 104, and two doped regions 114 having a second conductivity type. In the following embodiments, a first conductive type and a second conductive type are different conductive types. Namely, when the first conductivity type is an N-type, the second conductivity type is a P-type; and when the first conductivity type is the P-type, the second conductivity type is the N-type. In the present embodiment, the first conductivity type is, for example, the P-type, and the second conductivity type is, for example, the N-type, though the invention is not limited thereto. The P-type dopant is, for example, boron; and the N-type dopant is, for example, phosphorus or arsenic.

In some embodiments, the substrate 100 is a semiconductor substrate including silicon. Alternatively, the substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In other embodiments, the substrate 100 may be a semiconductor on insulator (SOI). The semiconductor substrate 100 may include a doped epitaxial layer, a gradient semiconductor layer, and/or a semiconductor layer overlying another semiconductor layer of a different type, such as a silicon layer on a silicon germanium layer. In the present embodiment, the substrate 100 is a p-doped silicon substrate. P-type dopants that the substrate 100 are doped with include boron, gallium, indium, other suitable p-type dopants, or combinations thereof. Because the depicted substrate 100 includes a p-doped substrate, doping configurations described below should be read consistent with a p-doped substrate. In some embodiments, a doping concentration of the substrate 100 is about $1 \times 10^{13}$ atoms/cm$^3$ to about $1 \times 10^{16}$ atoms/cm$^3$. The substrate 100 may alternatively include an n-doped substrate, in which case, the doping configurations described below should be read consistent with an n-doped substrate (for example, read with doping configurations having an opposite conductivity). N-type dopants that the substrate 100 can be doped with include phosphorus, arsenic, other suitable n-type dopants, or combinations thereof. In the following embodiments, the first conductivity type is referred as the P-type, and the second conductivity type is referred as the N-type, for example.

As shown in FIG. 1 and FIG. 2A, the isolation structure 101 is formed in the substrate 100 to isolate an active region 110 of the substrate 100. In some embodiments, the isolation structure 101 divides the substrate 100 as the active region 110. In alternatively embodiments, the active region 110 is defined by the isolation structure 101. In some embodiments, the isolation structure 101 may also isolate the semiconductor device 10 from other devices (not shown). In other embodiments, the isolation structure 101 utilizes shallow trench isolation (STI) technology to form STI features that define and electrically isolate the various regions. Alternatively, the isolation structure 101 utilizes another isolation technology, such as local oxidation of silicon (LOCOS). In some embodiments, the isolation structure 101 comprises silicon oxide, silicon nitride, silicon oxynitride, other suitable materials, or combinations thereof. The isolation structure 101 may be formed by a suitable process. As one example, forming a STI feature includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure such as a thermal oxide liner layer filled with silicon nitride or silicon oxide. In another example, the STI structure may be formed using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

As shown in FIG. 2A, FIG. 2B, and FIG. 2C, the well region 102 is formed to surround a bottom surface and sidewalls of the isolation structure 101. Therefore, the well region 102 is formed a native region 120 in the active region 110. The well region 102 extends from the top surface of the substrate 100 a depth D2 into the substrate 100, while the isolation structure 101 extends from the top surface of the substrate 100 a depth D1 into the substrate 100. In some embodiments, the depth D2 is greater than the depth D1. Therefore, as shown in FIG. 2A, the isolation structure 101 is formed in the well region 102, a sidewall of the well region 102 is separated from a sidewall of the isolation structure 101 by a distance 102$d$, and a bottom surface of the well region 102 is separated from a bottom surface of the isolation structure 101 by a distance 102$b$. The well region 102 are formed by implanting the substrate 100 with a p-type dopant, such as boron, and subjecting the well region 102 to an annealing process, such as a rapid thermal anneal or laser anneal. Alternatively, the well region 102 are formed by another suitable process, such as a diffusion process. In some embodiments, a doping concentration of the well region 102 is about $1 \times 10^{17}$ atoms/cm$^3$ to about $1 \times 10^{18}$ atoms/cm$^3$. However, the embodiments of the present invention are not limited thereto. In some embodiments, the doping concentration of the well region 102 may be adjusted by design needs.

Here, the native region 120 is a region without p-well or n-well implants, and thus, is free of n-well regions or p-well regions. As shown in FIG. 1 and FIG. 2A, the native region 120 is surrounded by the well region 102, such that the well region 102 define a boundary of the native region. In some embodiments, the native region 120 is formed without additional implantation, a doping concentration of the native region 120 is substantially equal to the doping concentration of the substrate 100. The doping concentration of the native region 120 and the doping concentration of the well region 102 are different by several orders of magnitude. In the present embodiment, the doping concentration of the well region 102 is greater than the doping concentration of the native region 120 by 2 to 5 orders of magnitude.

It should be noted that an area of the native region 120 is less than an area of the active region 110, as shown in FIG. 1. That is to say, the well region 102 extends from the boundary between the isolation structure 101 and the active region 110 into the active region 110, and the native region 120 is formed within the active region 110 and surrounded by an extension 103 of the well region 102. Herein, the extension 103 of the well region 102 is referred as the area or the distance 102$d$ extending from the sidewall of the isolation structure 101 into the active region 110. From another perspective, the extension 103 of the well region 102 is referred as a buffer region different from the conventional well region. In some embodiments, the extension 103 of the well region 102 is able to optimize the threshold voltage of the semiconductor device 10. Specifically, the threshold voltage of the semiconductor device 10 increases as the distance 102$d$ between the sidewall of the well region 102 and the sidewall of the isolation structure 101 increases. In other embodiments, the threshold voltage of the semiconductor device 10 increases as the doping concentration of the well region 102 increases. In other words, the threshold voltage of the semiconductor device 10 is able to be adjusted by controlling the range of the extension 103 of the well region 102. The range of the extension 103 of the well region 102 corresponds to the area of the native region 120. That is, when the range of the extension 103 of the well region 102 increases, the area of the native region 120 decreases. On the other hands, the threshold voltage of the semiconductor device 10 increases as the area of the native region 120 decreases. In some embodiments, the threshold voltage of the semiconductor device 10 is about 0.2 V to 0.4 V. However, the embodiments of the present invention are not limited thereto.

In addition, the extension 103 of the well region 102 is able to reduce the leakage current flowing along a path P under the isolation structure 101 as shown in FIG. 2B. That is to say, the leakage current of the semiconductor device 10 decreases as the distance 102b between the bottom surface of the well region 102 and the bottom surface of the isolation structure 101 increases. On the other hand, the leakage current of the semiconductor device 10 decreases as the doping concentration of the well region 102 increases.

As shown in FIG. 1, FIG. 2A, and FIG. 2B, the gate structure 104 is formed over the substrate 100 in the native region 120. The gate structure 104 extends from the active region 110 to cover a portion of a top surface of the isolation structure 101, as shown in FIG. 1 and FIG. 2B. In some embodiments, the gate structure 104 includes a gate dielectric layer 106, and a gate electrode 108. The gate dielectric layer 106 and the gate electrode 108 are formed over the substrate 100 in sequential order from bottom to top. As shown in FIG. 2A, the gate dielectric layer 106 is formed between the substrate 100 (or the native region 120) and the gate electrode 108. In some embodiments, the gate dielectric layer 106 includes silicon oxide, silicon nitride, silicon oxy-nitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. The gate dielectric layer 106 is formed using a suitable process such as atomic layer deposition (ALD), chemical vapor deposition (CVD), thermal oxidation, or a combination thereof. In some embodiments, the gate electrode 108 includes polysilicon and is formed using a suitable process such as chemical vapor deposition (CVD).

Referring to FIG. 2A, in some other embodiments, the gate structure 104 further includes spacers 112. The spacers 112 are formed over sidewalls of the gate dielectric layer 106 and sidewalls of the gate electrode 108. The spacers 112 are formed of silicon oxide, silicon nitride, silicon oxynitride, silicon carbide, fluoride-doped silicate glass (FSG), low-k dielectric materials, or a combination thereof. It should be noted that the low-k dielectric materials are generally dielectric materials having a dielectric constant lower than 3.9. The spacers 112 may have a multi-layer structure which includes one or more liner layers. The liner layer includes a dielectric material such as silicon oxide, silicon nitride, and/or other suitable materials. The formation of the spacers 112 may be formed by depositing suitable dielectric material and anisotropically etching off the dielectric material.

Referring to FIG. 2A, the doped regions 114 are formed respectively in the substrate 100 at two sides of the gate structure 104. The doped regions 114 are heavily doped with n-type dopant, such as phosphorus or arsenic. One skilled in the art will recognize that the term heavily doped are the term of art that describe a doping concentration of the region depending on the specific device type, technology generation, minimum feature size, and/or other factors. Accordingly, heavily doped should be interpreted in light of the technology being evaluated and not limited to the described embodiments herein. In some embodiments, a doping concentration of the doped regions 114 is about $1\times10^{19}$ atoms/cm$^3$ to about $1\times10^{20}$ atoms/cm$^3$. The doped regions 114 extends from the top surface of the substrate 100 a depth D3 into the substrate 100. The depth D3 of the doped regions 114 is less than the depth D1 of the isolation structure 101, and less than the depth D2 of the well region 102. In some alternatively embodiments, the doped regions 114 are referred as source and/or drain (S/D) regions, while the region below the gate structure 104 between the S/D regions is referred as a channel region 118 having the first conductivity type. In some embodiments, the channel region 118 is formed without additional implantation. Therefore, as shown in FIG. 2A, a doping concentration of the channel region 118 is substantially equal to the doping concentration of the substrate 100 and the native region 120. That is to say, the doping concentration of the channel region 118 is less than the doping concentration of the well region 102 by several orders of magnitude. Since the channel region 118 is a region without p-well, n-well, or threshold adjusting implants, the semiconductor device 10 is referred as the native device (or native transistor) with nearly zero or negative threshold voltage. Accordingly, the semiconductor device 10 having better electron mobility is useful for low-voltage, analog, and mixed signal applications, in some embodiments. In an embodiment, the semiconductor device 10 includes a planar semiconductor device or non-planar semiconductor device, such as FinFET.

It should be noted that, as shown in FIG. 1 and FIG. 2A, the doped regions 114 include first portions 115 and second portions 116. The first portions 115 are formed in the native region 120, and the second portions 116 are formed in the well region 102. From another perspective, the second portions 116 are formed at an overlapped region between the doped regions 114 and the well region 102. The doped regions 114 and the well region 102 have different conductivity types and the doping concentration of the doped regions 114 is greater than the doping concentration of the well region 102. By doping compensation, a doping concentration of the second portions 116 is less than the doping concentration of the first portions 115. In some embodiments, a ratio of the doping concentration of the first portions 115 to the doping concentration of the second portions 116 is about 10 to 1000.

As shown in FIG. 1 and FIG. 2A, in some embodiments, the second portions 116 is illustrated as a closed ring to surround the native region 120 and disposed between the doped regions 114 and the isolation structure 101. The second portions 116 has a depth 116d and a width 116w. The depth 116d of the second portions 116 extends from the top surface of the substrate 100 into the substrate 100. The depth 116d is substantially equal to the depth D3 of the doped regions 114, in some embodiments. The width 116w of the second portions 116 is defined as a distance between the sidewall of the isolation structure 101 and the sidewall of the well region 102. In some embodiments, the width 116w of the second portions 116 is substantially equal to the distance 102d.

The semiconductor device 10 may include additional features. For example, various contacts/vias/lines and multilayer interconnect features (e.g., metal layers and interlayer dielectrics) may be formed over the substrate 100, configured to connect the various features or structures of the semiconductor device 10. For example, the S/D regions 114 may be coupled with the multiplayer interconnect features by the contacts. In some embodiments, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 3A:
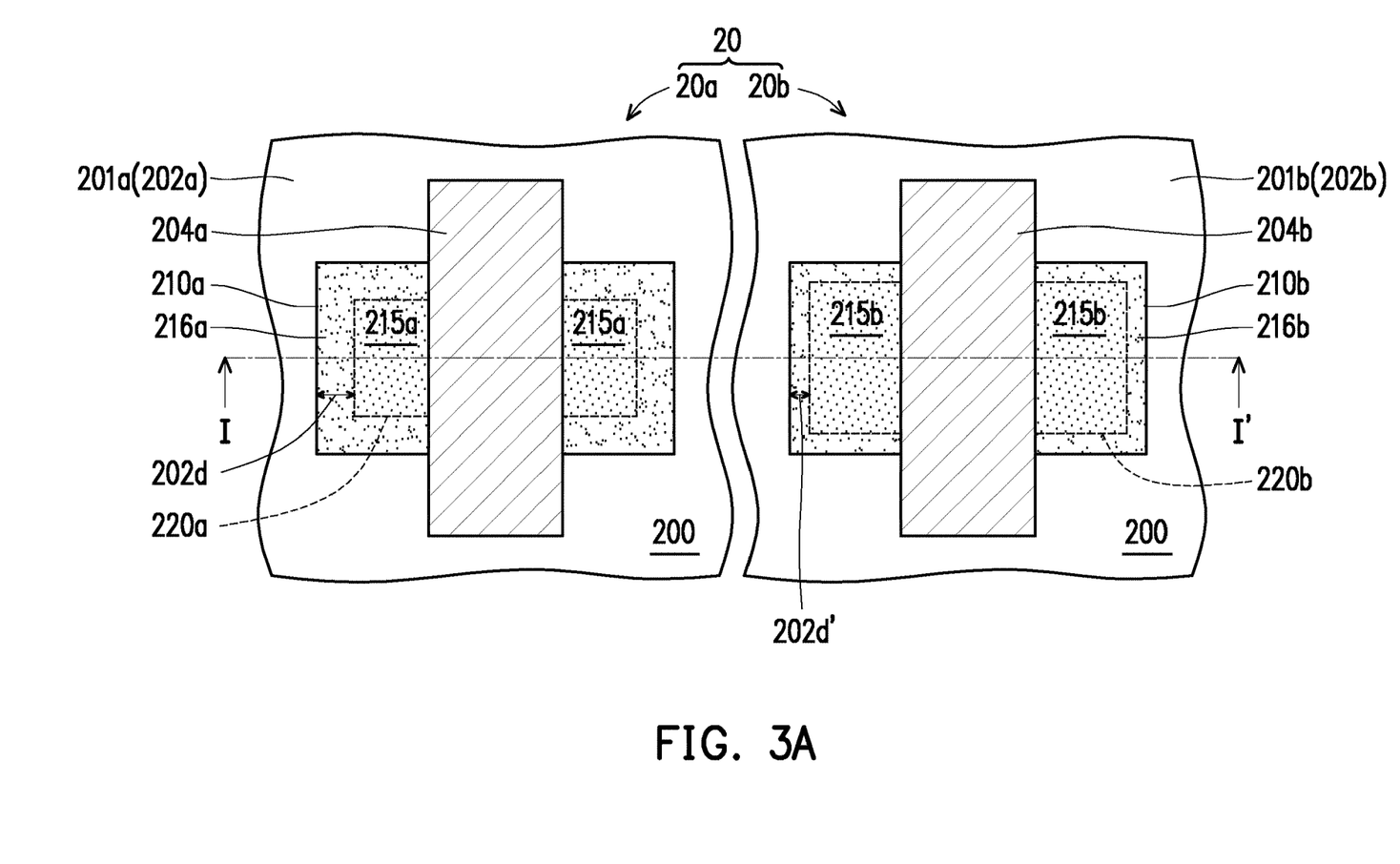
FIG. 3A is a top view of a semiconductor device in accordance with a second embodiment.
Figure 3B:
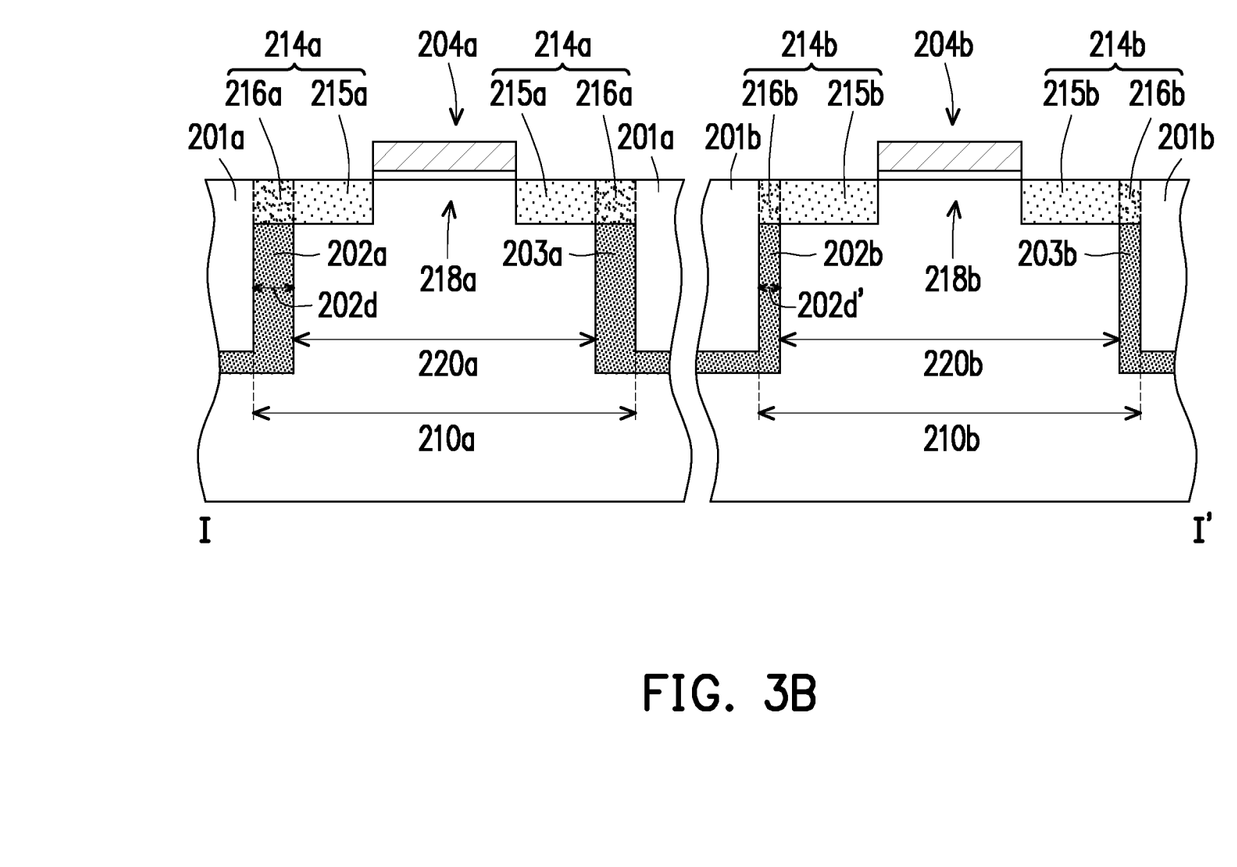
FIG. 3B is a cross-sectional view of the semiconductor device taken along the line I-I' of FIG. 3A.

FIG. 3A is a top view of a semiconductor device in accordance with a second embodiment. FIG. 3B is a cross-sectional view of the semiconductor device taken along the line I-I' of FIG. 3A.

Referring to FIG. 3A and FIG. 3B, a semiconductor device 20 includes a substrate 200 having a first conductivity type (e.g., P type), a first native transistor 20a, and a second native transistor 20b. The first native transistor 20a is formed aside the second native transistor 20b. A doping concentration and material of the substrate 200 are similar with the doping concentration and material of the substrate 100. Thus, details thereof are omitted here.

In detail, the first native transistor 20a includes a first isolation structure 201a, a first well region 202a having the first conductivity type, a first gate structure 204a, and two first doped regions 214a having a second conductivity type (e.g., N type). As shown in FIG. 3A and FIG. 3B, the first isolation structure 201a is disposed in the substrate 200 to define a first active region 210a. The first well region 202a surrounds a bottom surface and sidewalls of the first isolation structure 201a to form a first native region 220a in the first active region 210a. An area of the first native region 220a is less than an area of the first active region 210a. The first gate structure 204a is disposed over the substrate 200 in the first native region 220a. The first doped regions 214a are disposed respectively in the first native region 220a at two sides of the first gate structure 204a. The first doped regions 214a includes first portions 215a and second portions 216a. The first portions 215a are formed in the first native region 220a, and the second portions 216a are formed in the first well region 202a. In some embodiments, a doping concentration of the second portions 216a is less than a doping concentration of the first portions 215a. As shown in FIG. 3B, the first native transistor 20a further includes a first channel region 218a formed in the first native region 220a below the first gate structure 204a between the first doped regions 214a. A doping concentration of the first channel region 218a is less than a doping concentration of the first well region 202a. In some embodiments, the doping concentration of the first channel region 218a is substantially equal to the doping concentration of the substrate 200.

Similarly, the second native transistor 20b includes a second isolation structure 201b, a second well region 202b having the first conductivity type, a second gate structure 204b, and two second doped regions 214b having a second conductivity type. As shown in FIG. 3A and FIG. 3B, the second isolation structure 201b is disposed in the substrate 200 to define a second active region 210b. The second well region 202b surrounds a bottom surface and sidewalls of the second isolation structure 201b to form a second native region 220b in the second active region 210b. An area of the second native region 220b is less than an area of the second active region 210b. The second gate structure 204b is disposed over the substrate 200 in the second native region 220b. The second doped regions 214b are disposed respectively in the second native region 220b at two sides of the second gate structure 204b. The second doped regions 214b includes first portions 215b and second portions 216b. The first portions 215b are formed in the second native region 220b, and the second portions 216b are formed in the second well region 202b. In some embodiments, a doping concentration of the second portions 216b is less than a doping concentration of the first portions 215b. As shown in FIG. 3B, the second native transistor 20b further includes a second channel region 218b formed in the second native region 220b below the second gate structure 204b between the second doped regions 214b. A doping concentration of the second channel region 218b is less than a doping concentration of the second well region 202b. In some embodiments, the doping concentration of the second channel region 218b is substantially equal to the doping concentration of the substrate 200.

As shown in FIG. 3A and FIG. 3B, the arrangements, materials and forming methods of the first native transistor 20a, second native transistor 20b are similar to the arrangement, material and forming method of the semiconductor device 10. Thus, details thereof are omitted here. It should be noted that an area of the first native region 220a is different from an area of the second native region 220b. Specifically, as shown in FIG. 3A and FIG. 3B, a sidewall of the first well region 202a is separated from a sidewall of the first isolation structure 201a by a first distance 202d, while a sidewall of the second well region 202b is separated from a sidewall of the second isolation structure 201b by a second distance 202d'. The first distance 202d is greater than the second distance 202d'. That is to say, an extension 203a of the first well region 202a is greater than an extension 203b of the second well region 202b. In other embodiments, a ratio of a width of the first well region 202a in the first active region 210a to a width of the first active region 210a is greater than a ratio of a width of the second well region 202b in the second active region 210b to a width of the second active region 210b. From another perspective, a ratio of an area of the first native region 220a to an area of the first active region is 210a less than a ratio of an area of the second native region 220b to an area of the second active region 210b.

In some embodiments, a threshold voltage of the first native transistor 20a is greater than a threshold voltage of the second native transistor 20b when the extension 203a of the first well region 202a is greater than the extension 203b of the second well region 202b. In other embodiments, the threshold voltage of the first native transistor 20a is greater than the threshold voltage of the second native transistor 20b when a doping concentration of the first well region 202a is greater than a doping concentration of the second well region 202b. That is to say, the threshold voltage of the semiconductor device 20 is able to be adjusted by controlling the range of the extension 203a of the first well region 202a and/or the extension 203b of the second well region 202b. On the other hands, the extension 203a of the first well region 202a and/or the extension 203b of the second well region 202b is able to reduce the leakage current flowing along a path under the isolation structure. In detail, in some embodiments, the extension 203a of the first well region 202a is greater than the extension 203b of the second well region 202b, while a leakage current of the first native transistor 20a is less than a leakage current of the second native transistor 20b. In alternatively embodiments, the doping concentration of the first well region 202a is greater than the doping concentration of the second well region 202b, while the leakage current of the first native transistor 20a is less than the leakage current of the second native transistor 20b. This allows the semiconductor device 20 having different threshold voltages and leakage currents to be easily manufactured on a single wafer. Accordingly, product design is getting more flexibility to meet customers' needs. Different embodiments may have different advantages, and no particular advantage is necessarily required of any one embodiment.

Figure 4:
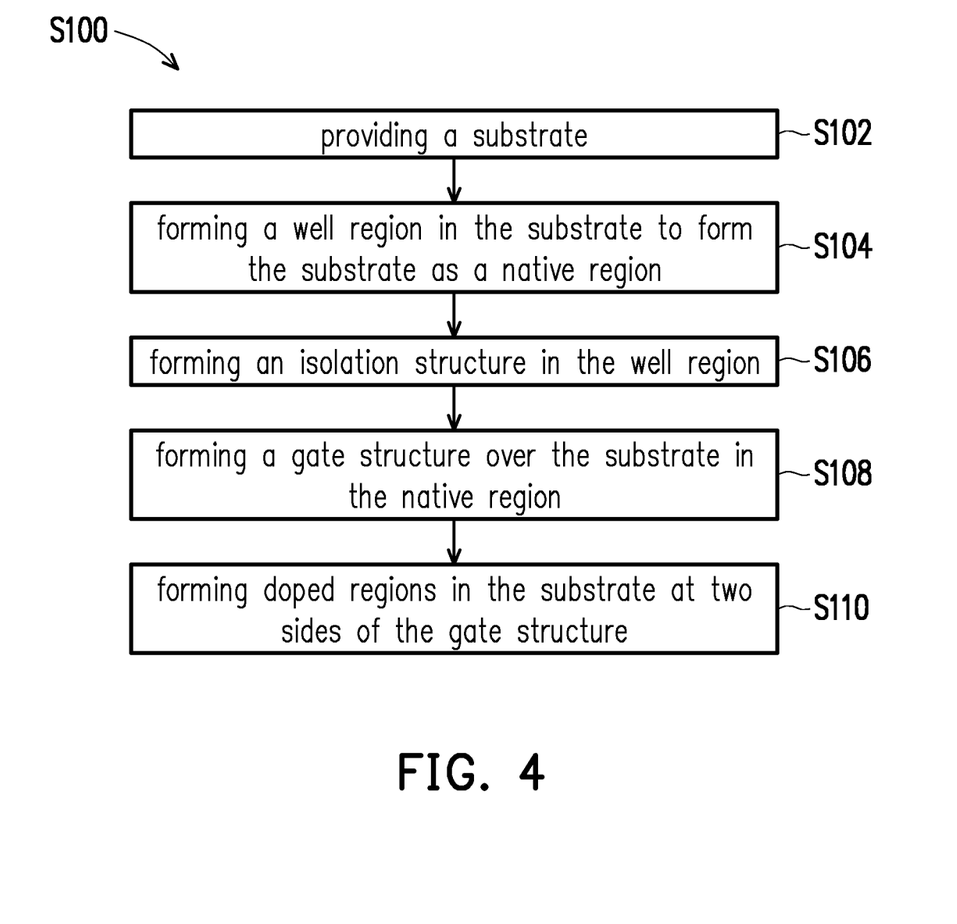
FIG. 4 is a flow chart of a method of fabricating a semiconductor device in accordance with some embodiments.

FIG. 4 is a flow chart of a method of fabricating a semiconductor device in accordance with some embodiments. The method S100 begins at block S102 where a substrate is provided. At block S104, a well region is formed in the substrate to divide the substrate as a native region. That is to say, the native region is defined by the well region. At block S106, an isolation structure is formed in the well region. At block S108, a gate structure is formed over the substrate in the native region. At block S110, doped regions are formed in the substrate at two sides of the gate structure. Additional steps can be provided before, during, and after the method S100, and some of the steps described can be replaced or eliminated for other embodiments of the method.

The method S100 can be implemented to fabricate the semiconductor devices 10 and 20 described above. Take the semiconductor device 10 as example, referring to FIG. 1 and FIG. 2A, at block S102, the substrate 100 having a first conductivity type (e.g., P type) is provided. At block S104, the well region 102 is formed by implanting the substrate 100 with p-type dopants, such as boron. In detail, steps of forming the well region 102 in the substrate 100 show as below. A mask layer (not shown) is formed over the substrate 100 to cover the native region 120. The mask layer and the isolation structure 101 are separated by a distance 102d (as shown in FIG. 1). After the mask layer is formed, a first ion implantation process is performed by using the mask layer as mask to form the well region 102. In some embodiments, the extension 103 of the well region 102 is formed at the step S104 with the conventional well region. However, the embodiments of the present invention are not limited thereto. In alternatively embodiments, the extension 103 of the well region 102 is formed before or after the conventional well region is formed. In some embodiments, a doping concentration of the well region 102 is greater than a doping concentration of the substrate 100. After well region 102 is formed, as shown in FIG. 1, a region surrounded by the well region 102 forms a native region 120.

At block S106, an isolation structure 101 is formed in the well region 102 to isolate the various features of the semiconductor device 10 by using suitable technologies, such as STI technology, LOCOS, etc. After the isolation structure 101 is formed, the well region 102 surrounds a bottom surface and sidewalls of the isolation structure 101 as shown in FIG. 2A. At block S108, a gate structure 104 is formed over the substrate 100 in the native region 120 by using suitable methods, such as CVD, PVD etc. At block S110, two doped regions 114 are formed by implanting the native region 110 and the well region 102 at two sides of the gate structure 104 with n-dopants, such as phosphorous or arsenic. In detail, steps of forming the doped regions 114 show as below. A second ion implantation process is performed by using the gate structure 104 and the isolation structure 101 as mask, to form the doped regions 114 in in the well region 102 and the native region 110 of the substrate 100 between the gate structure 104 and the isolation structure 101. As shown in FIG. 1 and FIG. 2A, the doped regions 114 include first portions 115 and second portions 116. The first portions 115 are formed in the native region 120 and the second portions 116 are formed in the well region 102. From another perspective, the second portions 116 are formed at an overlapped region between the doped regions 114 and the well region 102. In some embodiments, a doping concentration of the second portions 116 is less than a doping concentration of the first portions 115.

Further, the semiconductor devices 10 and 20 are easily formed on a same wafer by using standard CMOS processes without implementing extra processing (such as extra masking steps) and/or process costs. This allows semiconductor devices 10 and 20 having different threshold voltages and leakage currents to be easily manufactured on a single integrated circuit device. Therefore, the method of fabrication the semiconductor devices 10 and 20 has advantages of mass production and cost down, so that the product has commercial competitiveness. Different embodiments may have different advantages, and no particular advantage is necessarily required of any one embodiment.

According to some embodiments, a semiconductor device includes: a substrate having a lower portion and an upper portion on the lower portion; an isolation region disposed on the lower portion of the substrate and surrounding the upper portion of the substrate in a closed path; a gate structure disposed on and across the upper portion of the substrate; source and/or drain (S/D) regions disposed in the upper portion of the substrate at opposite sides of the gate structure; and a channel region disposed below the gate structure and abutting between the S/D regions, wherein the channel region and the S/D regions have different conductivity types, and the channel region and the substrate have the same conductivity type.

According to some embodiments, a transistor includes: a substrate having a P-type conductivity; an isolation region disposed in the substrate to divided the substrate into a lower portion and an upper portion, wherein the upper portion extends along a first direction, and wherein the isolation region comprises: a dielectric material extending from a top surface of the upper portion to a top surface of the lower portion; and a doped region physically separating a sidewall and a bottom surface of the dielectric material from the substrate; a gate structure extending along a second direction different from the first direction and across the upper portion; source and/or drain (S/D) regions having a N-type conductivity and disposed in the upper portion of the substrate at opposite sides of the gate structure; and a channel region disposed below the gate structure and abutting between the S/D regions, wherein the channel region has the P-type conductivity type and the channel region has a doping concentration substantially equal to a doping concentration of the substrate.

According to some embodiments, a semiconductor device includes a first transistor and a second transistor. The first transistor includes: a first substrate having a first lower portion and a first upper portion on the first lower portion; a first isolation region disposed on the first lower portion of the first substrate and surrounding the first upper portion of the first substrate in a closed path; a first gate structure disposed on and across the first upper portion of the first substrate; first source and/or drain (S/D) regions disposed in the first upper portion of the first substrate at opposite sides of the first gate structure; and a first channel region disposed below the first gate structure and abutting between the first S/D regions. The second transistor includes: a second substrate having a second lower portion and a second upper portion on the second lower portion; a second isolation region disposed on the second lower portion of the second substrate and surrounding the second upper portion of the second substrate in a closed path; a second gate structure disposed on and across the second upper portion of the second substrate; second source and/or drain (S/D) regions disposed in the second upper portion of the second substrate at opposite sides of the second gate structure; and a second channel region disposed below the second gate structure and abutting between the second S/D regions. A first width of the first upper portion of the first substrate is less than a second width of the second upper portion of the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a lower portion and an upper portion on the lower portion;
   an isolation region disposed on the lower portion of the substrate and surrounding the upper portion of the substrate in a closed path;
   a gate structure disposed on and across the upper portion of the substrate;
   source and/or drain (S/D) regions disposed in the upper portion of the substrate at opposite sides of the gate structure; and
   a channel region disposed below the gate structure and abutting between the S/D regions, wherein the channel region and the S/D regions have different conductivity types, and the channel region and the substrate have the same conductivity type, wherein the isolation region comprises:
   a dielectric material extending from a top surface of the upper portion to a top surface of the lower portion; and
   a doped region wrapping a sidewall and a bottom surface of the dielectric material, wherein the doped region and the S/D regions have different conductivity types.

2. The semiconductor device of claim 1, wherein the doped region and the S/D regions meet at an overlapped region between the S/D regions and the dielectric material, and a doping concentration of the overlapped region is less than a doping concentration of the S/D regions.

3. The semiconductor device of claim 1, wherein the semiconductor device is configured to have a threshold voltage increasing as a doping concentration of the doped region increases.

4. The semiconductor device of claim 1, wherein the semiconductor device is configured to have a leakage current decreasing as a doping concentration of the doped region increases.

5. The semiconductor device of claim 1, wherein the doped region is physically separated from the channel region by the S/D regions, and a doping concentration of the doped region is greater than a doping concentration of the channel region by 2 to 5 orders of magnitude.

6. The semiconductor device of claim 1, wherein the semiconductor device is configured to have a threshold voltage increasing as a width of the upper portion of the substrate decreases.

7. The semiconductor device of claim 1, wherein the isolation region has a first depth greater than a second depth of the S/D regions, and the semiconductor device is configured to have a leakage current decreasing as the first depth of the isolation region increases.

8. A transistor, comprising:
   a substrate having a P-type conductivity;
   an isolation region disposed in the substrate to divided the substrate into a lower portion and an upper portion, wherein the upper portion extends along a first direction, and wherein the isolation region comprises:
   a dielectric material extending from a top surface of the upper portion to a top surface of the lower portion; and
   a doped region physically separating a sidewall and a bottom surface of the dielectric material from the substrate;
   a gate structure extending along a second direction different from the first direction and across the upper portion;
   source and/or drain (S/D) regions having a N-type conductivity and disposed in the upper portion of the substrate at opposite sides of the gate structure; and
   a channel region disposed below the gate structure and abutting between the S/D regions, wherein the channel region has the P-type conductivity type and the channel region has a doping concentration substantially equal to a doping concentration of the substrate.

9. The transistor of claim 8, wherein the transistor is configured to have a threshold voltage increasing as a doping concentration of the doped region increases.

10. The transistor of claim 8, wherein the transistor is configured to have a leakage current decreasing as a doping concentration of the doped region increases.

11. The transistor of claim 8, wherein the doped region protrudes from the sidewall and the bottom surface of the dielectric material by a distance, and the transistor is configured to have a leakage current decreasing as the distance of the doped region increases.

12. The transistor of claim 8, wherein the doped region is physically separated from the channel region by the S/D regions, and a doping concentration of the doped region is greater than a doping concentration of the channel region by 2 to 5 orders of magnitude.

13. The transistor of claim 8, wherein the transistor is configured to have a threshold voltage increasing as a width of the upper portion of the substrate decreases.

14. A semiconductor device, comprising:
   a first transistor comprising:
     a first substrate having a first lower portion and a first upper portion on the first lower portion;
     a first isolation region disposed on the first lower portion of the first substrate and surrounding the first upper portion of the first substrate in a closed path;
     a first gate structure disposed on and across the first upper portion of the first substrate;
     first source and/or drain (S/D) regions disposed in the first upper portion of the first substrate at opposite sides of the first gate structure; and
     a first channel region disposed below the first gate structure and abutting between the first S/D regions;
   a second transistor comprising:
     a second substrate having a second lower portion and a second upper portion on the second lower portion;
     a second isolation region disposed on the second lower portion of the second substrate and surrounding the second upper portion of the second substrate in a closed path;
     a second gate structure disposed on and across the second upper portion of the second substrate;
     second source and/or drain (S/D) regions disposed in the second upper portion of the second substrate at opposite sides of the second gate structure; and
     a second channel region disposed below the second gate structure and abutting between the second S/D regions, wherein a first width of the first upper portion of the first substrate is less than a second width of the second upper portion of the second substrate.

15. The semiconductor device of claim 14, wherein a threshold voltage of the first transistor is greater than a threshold voltage of the second transistor.

16. The semiconductor device of claim 14, wherein the first isolation region comprises:
a first dielectric material extending from a top surface of the first upper portion to a top surface of the first lower portion; and
a first doped region wrapping a sidewall and a bottom surface of the first dielectric material, wherein the first doped region and the first S/D regions have different conductivity types.

17. The semiconductor device of claim 16, wherein the second isolation region comprises:
a second dielectric material extending from a top surface of the second upper portion to a top surface of the second lower portion; and
a second doped region wrapping a sidewall and a bottom surface of the second dielectric material, wherein the second doped region and the second S/D regions have different conductivity types.

18. The semiconductor device of claim 17, wherein the first doped region protrudes from the sidewall and the bottom surface of the first dielectric material by a first distance, the second doped region protrudes from the sidewall and the bottom surface of the second dielectric material by a second distance, and the first distance is greater than the second distance.

19. The semiconductor device of claim 14, wherein the first channel region and the first substrate have the same conductivity type, and the first channel region has a doping concentration substantially equal to a doping concentration of the first substrate; wherein the second channel region and the second substrate have the same conductivity type, and the second channel region has a doping concentration substantially equal to a doping concentration of the second substrate.

20. The semiconductor device of claim 1, wherein the semiconductor device comprises a native transistor.

* * * * *